United States Patent
Itamoto et al.

(10) Patent No.: US 12,230,938 B2
(45) Date of Patent: Feb. 18, 2025

(54) OPTICAL SEMICONDUCTOR DEVICE

(71) Applicant: Mitsubishi Electric Corporation, Tokyo (JP)

(72) Inventors: Hiromitsu Itamoto, Tokyo (JP); Akihiro Matsusue, Tokyo (JP); Takuro Shinada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 684 days.

(21) Appl. No.: 17/620,418

(22) PCT Filed: Oct. 25, 2019

(86) PCT No.: PCT/JP2019/042003
§ 371 (c)(1),
(2) Date: Dec. 17, 2021

(87) PCT Pub. No.: WO2021/079510
PCT Pub. Date: Apr. 29, 2021

(65) Prior Publication Data
US 2022/0352690 A1    Nov. 3, 2022

(51) Int. Cl.
*H01S 5/042*    (2006.01)
*H01S 5/023*    (2021.01)
(Continued)

(52) U.S. Cl.
CPC .............. *H01S 5/042* (2013.01); *H01S 5/023* (2021.01); *H01S 5/0239* (2021.01);
(Continued)

(58) Field of Classification Search
CPC .............................................. H01S 5/023–0239
See application file for complete search history.

(56) References Cited

U.S. PATENT DOCUMENTS 5,005,178 A * 4/1991 Kluitmans ........... G02B 6/4202
372/38.1
5,602,672 A * 2/1997 Ishimura ............... G02F 1/0121
359/245
(Continued)

FOREIGN PATENT DOCUMENTS

CN    107070200 A * 8/2017 .............. H02M 3/06
CN    107359157 A * 11/2017 ....... H01L 23/49838
(Continued)

OTHER PUBLICATIONS

International Search Report issued in PCT/JP2019/042003; mailed Jan. 7, 2020.
(Continued)

*Primary Examiner* — Joshua King
(74) *Attorney, Agent, or Firm* — Studebaker & Brackett PC

(57) ABSTRACT

A first conductive pattern (13) is provided on an upper surface of the submount (7). A GND pattern (9) is provided on a lower surface of the submount (7). A lower surface electrode (21) of a capacitor (3) is bonded to the first conductive pattern (13) with solder (22). An upper surface electrode (23) of the capacitor (3) is connected to a light emitting device (2). A terminating resistor (4) is connected to the first conductive pattern (13). The first conductive pattern (13) has a protruding portion (25) which protrudes outside from the capacitor (3) in planar view. A width of the protruding portion (25) is narrower than a width of the capacitor (3).

6 Claims, 6 Drawing Sheets

(51) Int. Cl.
  *H01S 5/0237* (2021.01)
  *H01S 5/0239* (2021.01)
  *H01S 5/026* (2006.01)
  *H01S 5/06* (2006.01)

(52) U.S. Cl.
  CPC ........... *H01S 5/0237* (2021.01); *H01S 5/0265* (2013.01); *H01S 5/0601* (2013.01)

(56) References Cited

U.S. PATENT DOCUMENTS

| | | | | |
|---|---|---|---|---|
| 6,057,954 | A * | 5/2000 | Parayanthal | G02F 1/0327 |
| | | | | 372/38.1 |
| 6,181,718 | B1 * | 1/2001 | Kobayashi | H01S 5/02251 |
| | | | | 372/38.1 |
| 6,323,986 | B1 * | 11/2001 | Lee | H04B 10/505 |
| | | | | 359/248 |
| 6,437,899 | B1 * | 8/2002 | Noda | G02F 1/025 |
| | | | | 359/245 |
| 8,830,552 | B2 * | 9/2014 | Hirayama | H01P 5/02 |
| | | | | 333/33 |
| 9,705,602 | B2 * | 7/2017 | Murakami | H04B 10/40 |
| 2003/0090774 | A1 * | 5/2003 | Singh | G02F 1/01708 |
| | | | | 359/248 |
| 2003/0218233 | A1 * | 11/2003 | Ueda | H01L 27/0641 |
| | | | | 257/E25.031 |
| 2004/0207432 | A1 | 10/2004 | Otsuka et al. | |
| 2005/0067698 | A1 * | 3/2005 | Aruga | H01S 5/0427 |
| | | | | 257/737 |
| 2006/0007516 | A1 * | 1/2006 | Kagaya | G02F 1/0121 |
| | | | | 359/245 |
| 2006/0008194 | A1 * | 1/2006 | Kagaya | G02F 1/0121 |
| | | | | 385/1 |
| 2007/0248363 | A1 * | 10/2007 | Kagaya | H01S 5/02325 |
| | | | | 385/2 |
| 2008/0252395 | A1 * | 10/2008 | Liu | H03H 7/1708 |
| | | | | 333/177 |
| 2010/0232806 | A1 * | 9/2010 | Kagaya | H05K 1/0246 |
| | | | | 398/183 |
| 2011/0304012 | A1 * | 12/2011 | Kim | H01L 27/0805 |
| | | | | 257/532 |
| 2012/0075042 | A1 * | 3/2012 | Hu | H01P 3/003 |
| | | | | 333/238 |
| 2012/0120472 | A1 * | 5/2012 | Uesugi | G02F 1/2255 |
| | | | | 359/237 |
| 2013/0010343 | A1 * | 1/2013 | Hirayama | G02F 1/0121 |
| | | | | 359/238 |
| 2014/0185638 | A1 * | 7/2014 | Tamanuki | H01S 5/0261 |
| | | | | 372/38.02 |
| 2016/0129513 | A1 * | 5/2016 | Oka | B23K 3/0623 |
| | | | | 372/38.07 |
| 2016/0308330 | A1 * | 10/2016 | Liffran | H01S 5/0428 |
| 2018/0067341 | A1 * | 3/2018 | Kanazawa | H01S 5/0265 |
| 2018/0123697 | A1 * | 5/2018 | Kubota | G02B 27/283 |
| 2018/0131330 | A1 * | 5/2018 | Itabashi | H03F 3/54 |
| 2018/0278017 | A1 * | 9/2018 | Mignoli | H01S 5/0428 |
| 2019/0107739 | A1 | 4/2019 | Yamaji et al. | |
| 2019/0237934 | A1 * | 8/2019 | Adachi | H04B 10/505 |
| 2020/0083663 | A1 * | 3/2020 | Tsuchiyama | H01S 5/0231 |
| 2021/0033806 | A1 * | 2/2021 | Noguchi | G02B 6/4281 |
| 2021/0044078 | A1 * | 2/2021 | Adachi | H01S 5/0239 |
| 2021/0057877 | A1 * | 2/2021 | Hirayama | H01S 5/0265 |
| 2021/0076500 | A1 * | 3/2021 | Noguchi | H05K 1/14 |

FOREIGN PATENT DOCUMENTS

| | | | | |
|---|---|---|---|---|
| CN | 109407226 A | * | 3/2019 | ........... G02B 6/4263 |
| DE | 2653554 C2 | | 3/1988 | |
| DE | 102018106860 A1 | * | 9/2018 | ........... G01S 7/4813 |
| DE | 102018211816 A1 | * | 1/2020 | |
| EP | 1655630 A2 | * | 5/2006 | ........... G02F 1/0121 |
| JP | 2001257435 A | * | 9/2001 | |
| JP | 2004-259722 A | | 9/2004 | |
| JP | 2015228396 A | * | 12/2015 | |
| JP | 2016-180779 A | | 10/2016 | |
| JP | 2019-71402 A | | 5/2019 | |
| JP | 2019-102827 A | | 6/2019 | |
| WO | WO-2004008593 A1 | * | 1/2004 | ........... G02B 6/4204 |
| WO | WO-2016021203 A1 | * | 2/2016 | ........... B23K 1/0016 |
| WO | 2018/229978 A1 | | 12/2018 | |
| WO | WO-2019172332 A1 | * | 9/2019 | ....... H01L 23/49838 |

OTHER PUBLICATIONS

An Office Action; "Notice of Reasons for Refusal," mailed by the Japanese Patent Office on Mar. 24, 2020, which corresponds to Japanese Patent Application No. 2020-510617 with partial English language translation.

* cited by examiner

OPTICAL SEMICONDUCTOR DEVICE

FIELD

The present disclosure relates to an optical semiconductor device.

BACKGROUND

An optical semiconductor device includes a light emitting device, a capacitor and a terminating resistor (see, for example, PTL 1). A lower surface electrode of the capacitor is connected to a conductive pattern provided on an upper surface of a submount via solder. In related art, the conductive pattern is made larger than the capacitor. This enables appearance inspection of wettability of solder by observing solder protruding from the capacitor from above.

CITATION LIST

Patent Literature

[PTL 1] JP 2016-180779 A

SUMMARY

Technical Problem

However, making the conductive pattern larger increases parasitic capacity between a GND pattern on a lower surface side of the submount and the conductive pattern on an upper surface side. This leads to a problem that amplitude response at a frequency used at the optical semiconductor device decrease and sensitivity of signals is lowered as a result of an increase in noise.

The present invention has been made to solve the problem as described above, and an object of the present invention is to provide an optical semiconductor device which enables appearance inspection of solder and which can achieve improvement in sensitivity of signals.

Solution to Problem

An optical semiconductor device according to the present disclosure includes: a submount; a first conductive pattern provided on an upper surface of the submount; a GND pattern provided on a lower surface side of the submount; a light emitting device; a capacitor having a lower surface electrode bonded to the first conductive pattern with solder and an upper surface electrode connected to the light emitting device; and a terminating resistor connected to the first conductive pattern, wherein the first conductive pattern has a protruding portion which protrudes outside from the capacitor in planar view, and a width of the protruding portion is narrower than a width of the capacitor.

Advantageous Effects of Invention

In the present disclosure, the conductive pattern has a protruding portion which protrudes outside from the capacitor in planar view. This enables appearance inspection of the solder by observing the solder on the protruding portion from above. A width of the protruding portion of the conductive pattern is narrower than a width of the capacitor. This reduces parasitic capacity between a GND pattern on the lower surface side of the submount and the conductive pattern on the upper surface side, so that it is possible to improve high frequency performance.

DESCRIPTION OF EMBODIMENTS

An optical semiconductor device according to the embodiments of the present disclosure will be described with reference to the drawings. The same components will be denoted by the same symbols, and the repeated description thereof may be omitted.

First Embodiment

Figure 1:
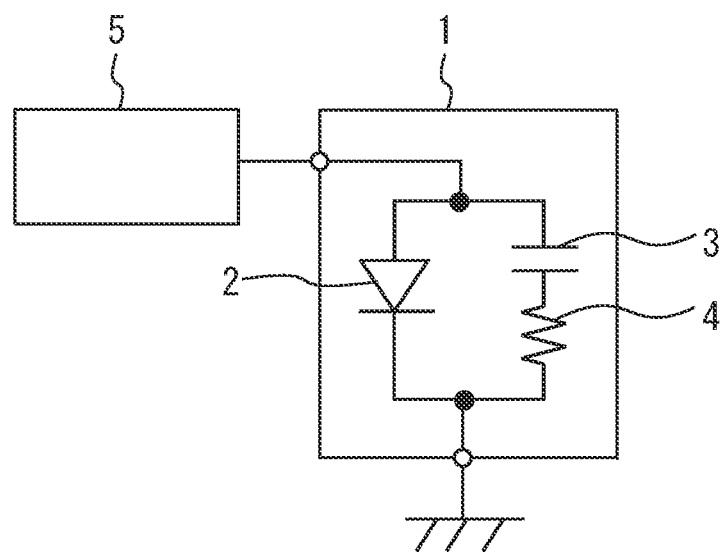
FIG. 1 is a circuit diagram of an optical semiconductor device according to a first embodiment.

FIG. 1 is a circuit diagram of an optical semiconductor device according to a first embodiment. An optical semiconductor device 1, which is a transmitter optical subassembly (TOSA), includes a light emitting device 2, a capacitor 3, and a terminating resistor 4. An anode of the light emitting device 2 is connected to a drive circuit 5, and a cathode is connected to a GND. The capacitor 3 and the terminating resistor 4 are connected in parallel with the light emitting device 2. The light emitting device 2 is, for example, an electro-absorption modulator laser diode (EML-LD). The light emitting device 2 emits light in accordance with a high-frequency modulated electric signal supplied from the drive circuit 5. Note that while the capacitor 3 and the terminating resistor 4 are connected in this order from the drive circuit 5 toward the GND in FIG. 1, connection order is not limited to this, and they may be connected in the order of the terminating resistor 4 and the capacitor 3 from the drive circuit 5 side.

Figure 2:
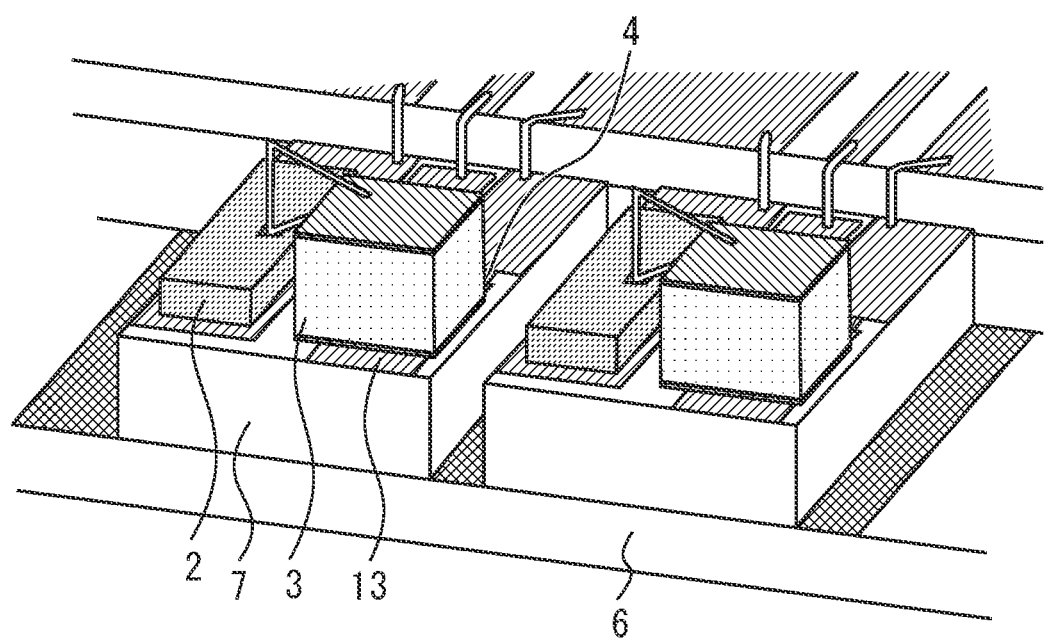
FIG. 2 is a perspective view illustrating the optical semiconductor device according to the first embodiment.
Figure 3:
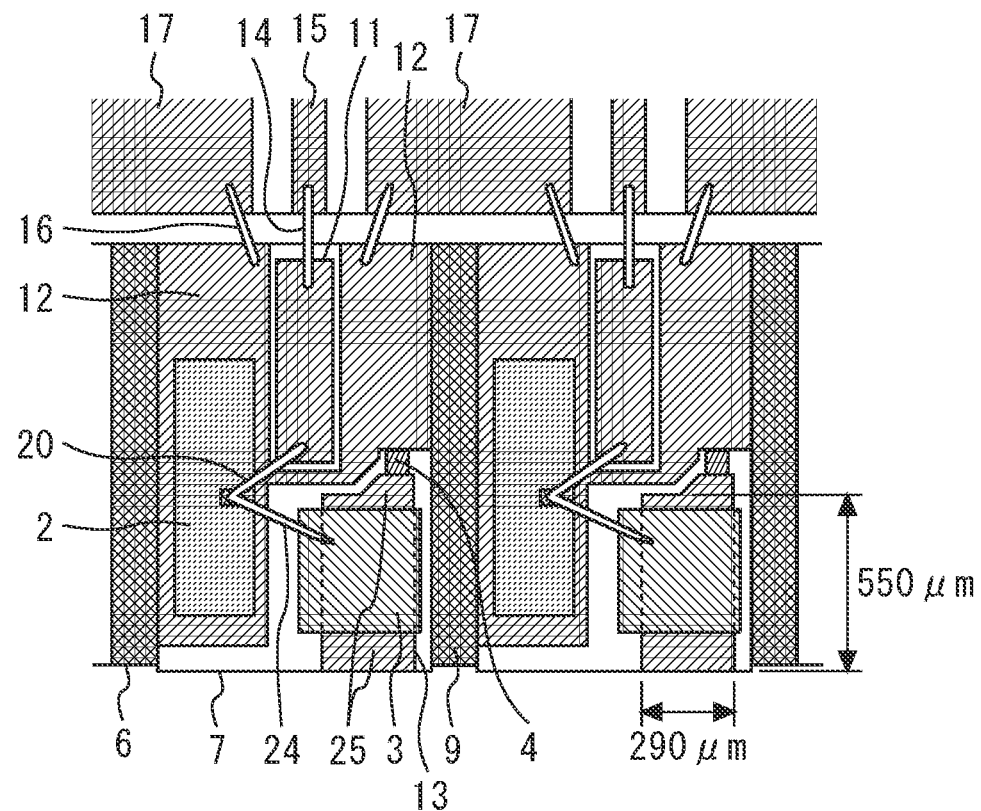
FIG. 3 is a plan view illustrating the optical semiconductor device according to the first embodiment.
Figure 4:
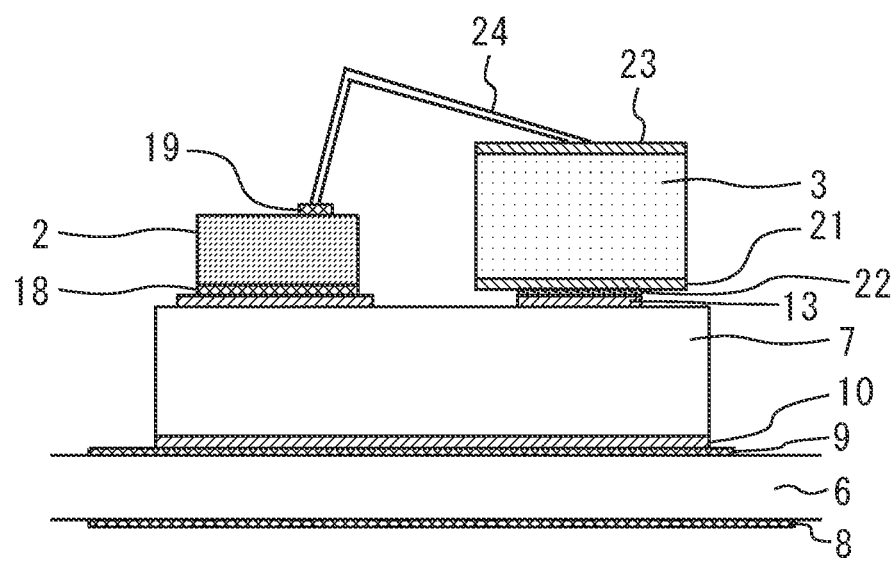
FIG. 4 is a side view illustrating the optical semiconductor device according to the first embodiment.

FIG. 2 is a perspective view illustrating the optical semiconductor device according to the first embodiment. FIG. 3 is a plan view illustrating the optical semiconductor device according to the first embodiment. FIG. 4 is a side view illustrating the optical semiconductor device according to the first embodiment.

A submount 7 is provided on a carrier substrate 6. The carrier substrate 6 and the submount 7 are formed with, for example, AlN. A conductive pattern 8 is provided on a lower surface of the carrier substrate 6. A conductive pattern 9 which is a GND pattern is provided on an upper surface of the carrier substrate 6. In the present embodiment, the conductive patterns 8 and 9 on the upper and lower surfaces of the carrier substrate 6 are made conductive with each other through a through-hole via, or the like. A conductive pattern 10 is provided on a lower surface of the submount 7. The conductive pattern 9 of the carrier substrate 6 is bonded to the conductive pattern 10 of the submount 7 with solder, or the like. Conductive patterns 11 to 13 which are separate from each other are provided on an upper surface of the submount 7. Note that surfaces of the conductive patterns 9 to 13 are gold-plated.

The conductive pattern 11 is connected to a modulated electric signal line 15 with a wire 14. The conductive pattern 12 is connected to a GND line 17 with a wire 16. Note that the GND line 17 is provided on both sides of the modulated electric signal line 15 and the conductive pattern 12 is provided on both sides of the conductive pattern 11, thereby coplanar waveguides are respectively formed. The modulated electric signal line 15 and the conductive pattern 11 transmit a modulated electric signal from the drive circuit 5.

The light emitting device 2 is provided on the conductive pattern 12. A lower surface electrode 18 of the light emitting device 2 is bonded to the conductive pattern 12 with solder, or the like. An upper surface electrode 19 of the light emitting device 2 is connected to the conductive pattern 11 with a wire 20.

The capacitor 3 is provided on the conductive pattern 13. A lower surface electrode 21 of the capacitor 3 is bonded to the conductive pattern 13 with solder 22. An upper surface electrode 23 of the capacitor 3 is connected to the upper surface electrode 19 of the light emitting device 2 with a wire 24. Note that the lower surface electrode 21 is provided on the whole surface of the lower surface of a dielectric body of the capacitor 3, and the upper surface electrode 23 is provided on the whole surface of the upper surface.

The terminating resistor 4 is provided on the upper surface of the submount 7 and is connected between the conductive pattern 12 and the conductive pattern 13. A resistance value of the terminating resistor 4 is set at 50Ω to achieve impedance matching. However, the resistance value of the terminating resistor 4 may be set at a value other than 50Ω. Note that while the wires 14, 16, 20, and 24 are, for example, gold wires, the wires may be ribbon-shaped gold wires.

The conductive pattern 13 has a rectangular planar shape, and the capacitor 3 has a quadrangular planar shape. The conductive pattern 13 has a long side of 550 μm, which is longer than sides of the capacitor 3. Thus, the conductive pattern 13 has a protruding portion 25 which protrudes outside from a region below the capacitor 3 in planar view viewed in a vertical direction with respect to the upper surface of the submount 7. This enables appearance inspection of the solder 22 by observing the solder 22 protruding from the capacitor 3 on the protruding portion 25 from above.

Meanwhile, the conductive pattern 13 has a short side of 290 μm, which is shorter than sides of the capacitor 3. Thus, a width of the protruding portion 25 of the conductive pattern 13 is narrower than a width of the capacitor 3 at a boundary of the protruding portion 25 and the capacitor 3.

Figure 5:
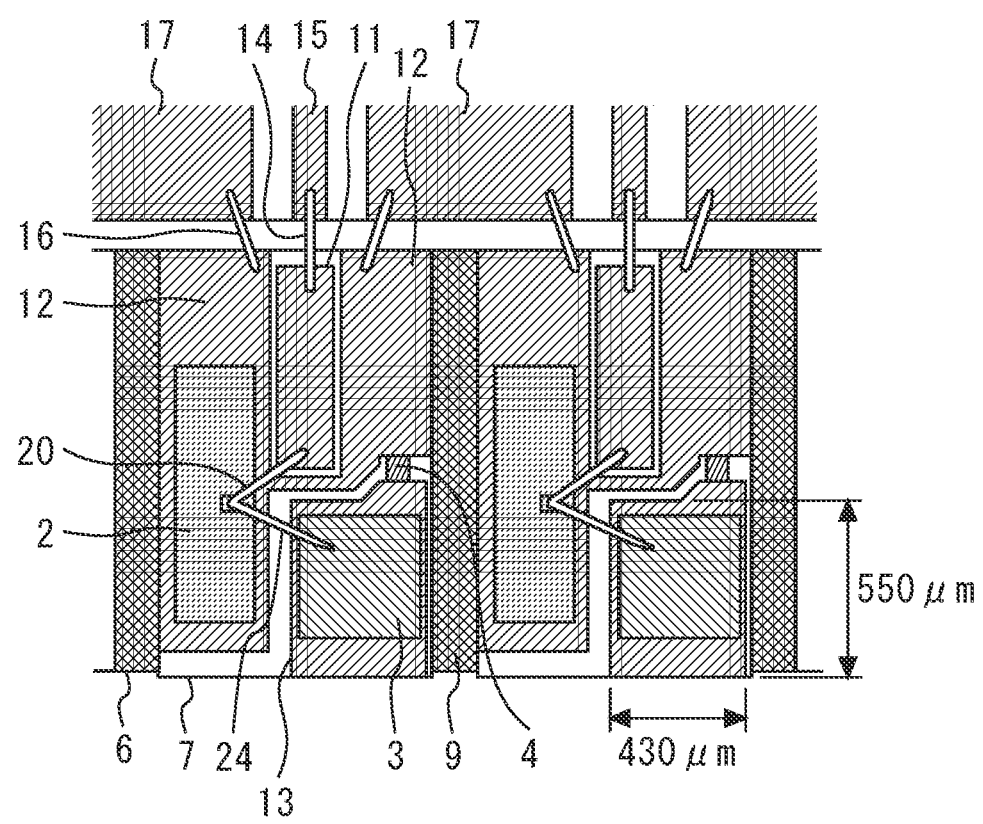
FIG. 5 is a plan view illustrating an optical semiconductor device according to the comparative example.

Subsequently, effects of the present embodiment will be described in comparison with a comparative example. FIG. 5 is a plan view illustrating an optical semiconductor device according to the comparative example. In the comparative example, the conductive pattern 13 has a short side of 430 μm, and the conductive pattern 13 is larger than the width of the capacitor 3. Thus, the conductive pattern 13 protrudes from all four sides at an outer periphery of the capacitor 3. It is therefore possible to perform appearance inspection of the solder 22. However, in the comparative example, the conductive pattern 13 is large, and thus, parasitic capacity between the conductive pattern 9 which is a GND pattern on the lower surface side of the submount 7 and the conductive pattern 13 on the upper surface side is large.

On the other hand, in the present embodiment, the width of the protruding portion 25 of the conductive pattern 13 is narrower than the width of the capacitor 3. This reduces parasitic capacity between the conductive pattern 9 and the conductive pattern 13, which increases amplitude responses at a frequency used at the optical semiconductor device. Thus, noise is reduced, and sensitivity of signals is improved, so that it is possible to improve high frequency performance.

Figure 6:
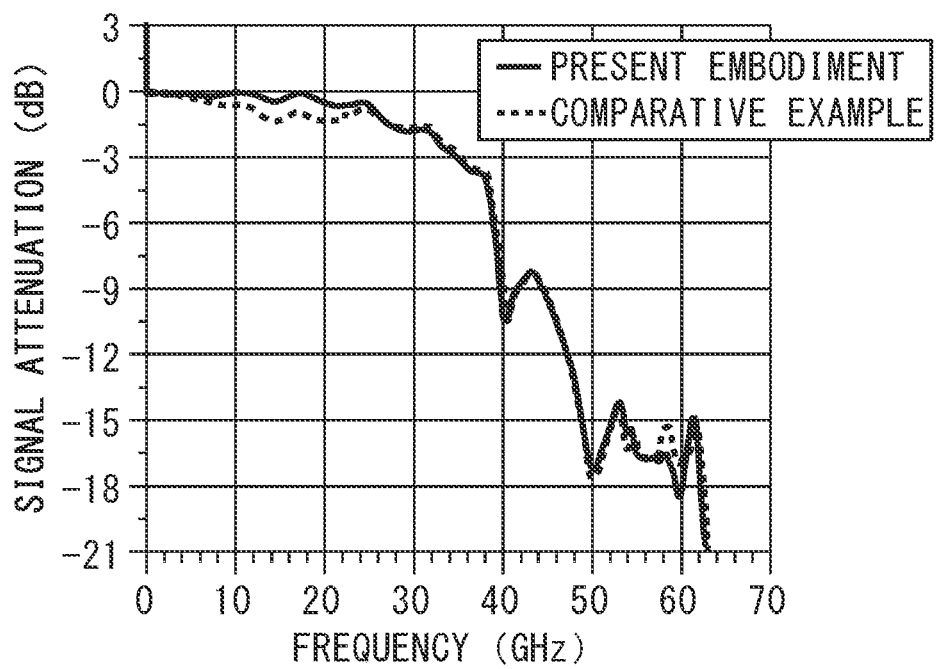
FIG. 6 is a simulation result indicating relationship between signal attenuation and a frequency.

FIG. 6 is a simulation result indicating relationship between signal attenuation and a frequency. In simulation, the resistance value of the terminating resistor 4 is set at 50Ω, and capacity of the capacitor 3 is set at 10 nF. FIG. 6 indicates a frequency of a signal input to the optical semiconductor device on a horizontal axis and indicates attenuation when the optical semiconductor device transmits a signal on a vertical axis. For example, in a case where a value on the vertical axis is −3 dB, signal intensity becomes half. In the comparative example, roll-off appears around 10 to 20 GHz which is a frequency used at the optical semiconductor device. On the other hand, in the present embodiment, it was confirmed that attenuation is close to 0 dB even around 10 to 20 GHz, and high frequency performance is achieved.

Further, the conductive pattern 13 has a rectangular planar shape, and the protruding portion 25 of the conductive pattern 13 protrudes from two facing sides of the capacitor 3. In this manner, the protruding portion 25 preferably protrudes from two or more portions at an outer periphery of the capacitor 3. This enables appearance inspection of the solder 22 at two or more portions, which leads to high reliability of the inspection.

Further, in a case where a device includes a plurality of sets each including the submount 7, the conductive pattern 13, the light emitting device 2, the capacitor 3, and the terminating resistor 4, further miniaturization of the device is needed. Concerning this, in the present embodiment, the conductive pattern 13 has a rectangular shape, and the protruding portion 25 does not protrude from sides of the capacitor 3 which are orthogonal in a short side direction of the conductive pattern 13. Thus, a width of the submount 7 of each set can be made smaller in a direction along the short side of the conductive pattern 13. Therefore, further miniaturization can be achieved by arranging the plurality of sets side-by-side in a direction along the short side of the conductive pattern 13.

Second Embodiment

Figure 7:
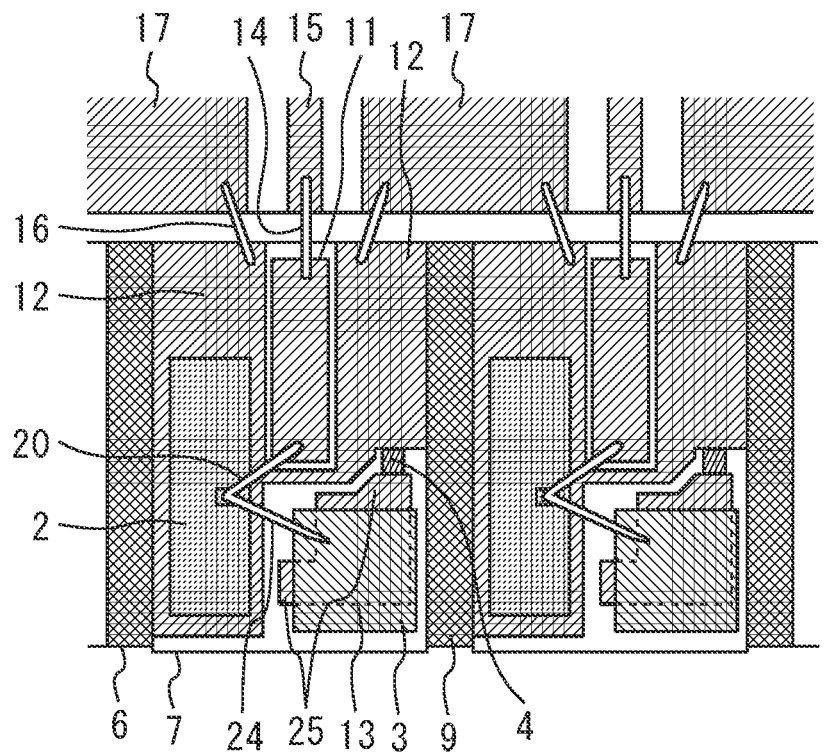
FIG. 7 is a plan view illustrating an optical semiconductor device according to a second embodiment.

FIG. 7 is a plan view illustrating an optical semiconductor device according to a second embodiment. The conductive pattern 13 has an L planar shape, and the protruding portion 25 of the conductive pattern 13 protrudes from two adjacent sides of the capacitor 3. In a similar manner to the first embodiment, the width of the protruding portion 25 of the conductive pattern 13 is narrower than the width of the capacitor 3 at a boundary of the protruding portion 25 and the capacitor 3. This reduces parasitic capacity between the conductive pattern 9 and the conductive pattern 13, so that it is possible to improve high frequency performance.

Further, the protruding portion 25 protrudes from two portions at an outer periphery of the capacitor 3, so that it is possible to perform appearance inspection of the solder 22 at two portions. Further, as a result of the conductive pattern 13 having an L shape, a length of the submount 7 in a vertical direction in the drawing can be made shorter. It is therefore possible to increase a resonant frequency of the submount 7 and improve high frequency performance. Other configurations and effects are similar to those in the first embodiment.

Third Embodiment

Figure 8:
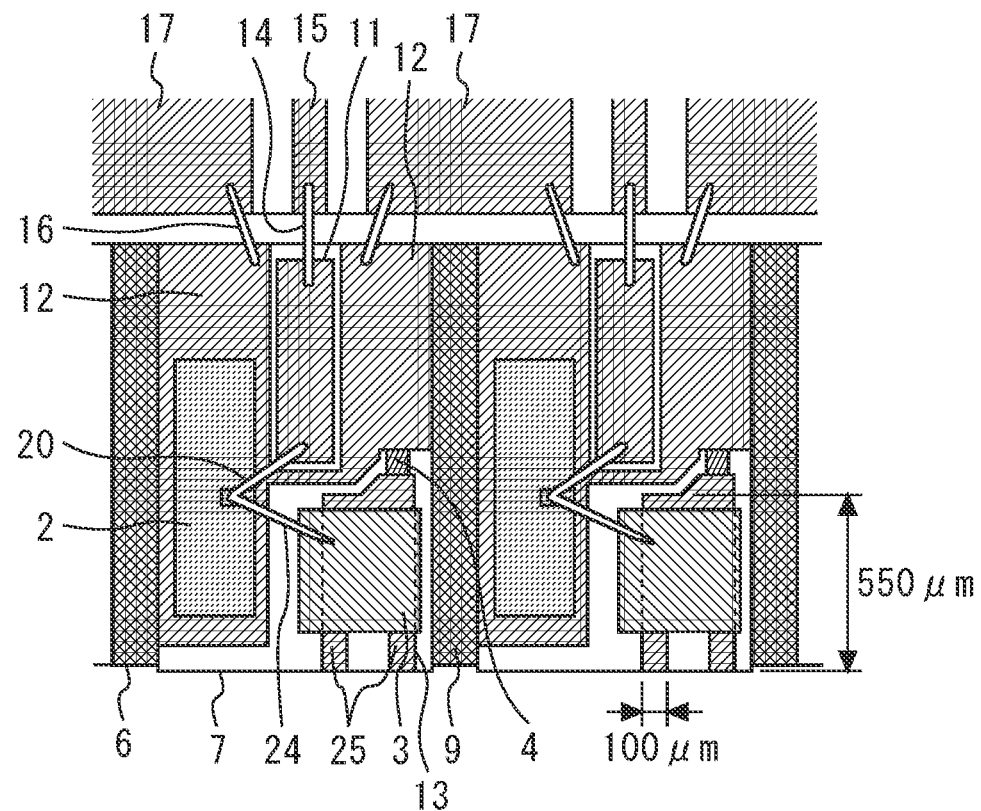
FIG. 8 is a plan view illustrating an optical semiconductor device according to a third embodiment.

FIG. 8 is a plan view illustrating an optical semiconductor device according to a third embodiment. The protruding portion 25 of the conductive pattern 13 has a comb tooth shape. This reduces an area of the protruding portion 25 and reduces parasitic capacity between the GND pattern 8 and the conductive pattern 13, so that it is possible to improve high frequency performance. Note that it is necessary to set a width of each comb tooth at equal to or greater than 100 µm to enable appearance inspection of the solder 22. Other configurations and effects are similar to those in the first embodiment.

Fourth Embodiment

Figure 9:
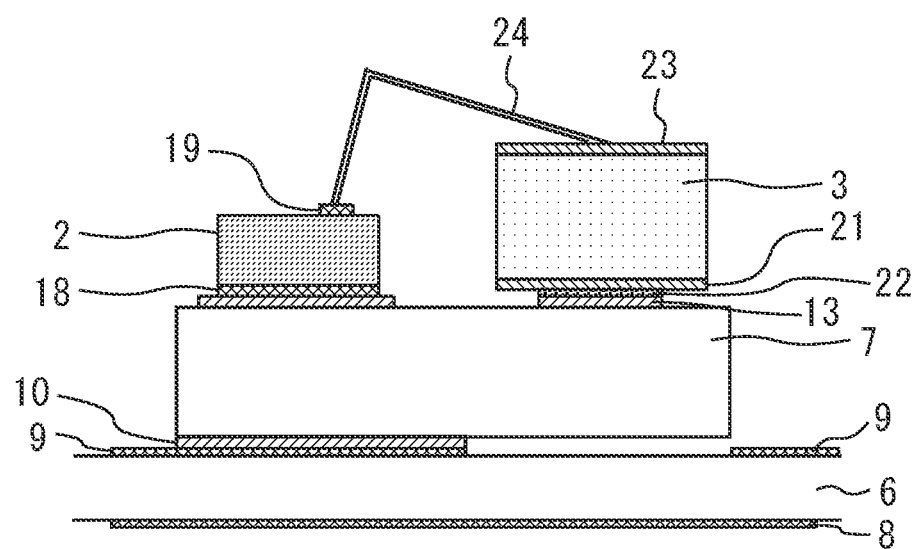
FIG. 9 is a side view illustrating an optical semiconductor device according to a fourth embodiment.
Figure 10:
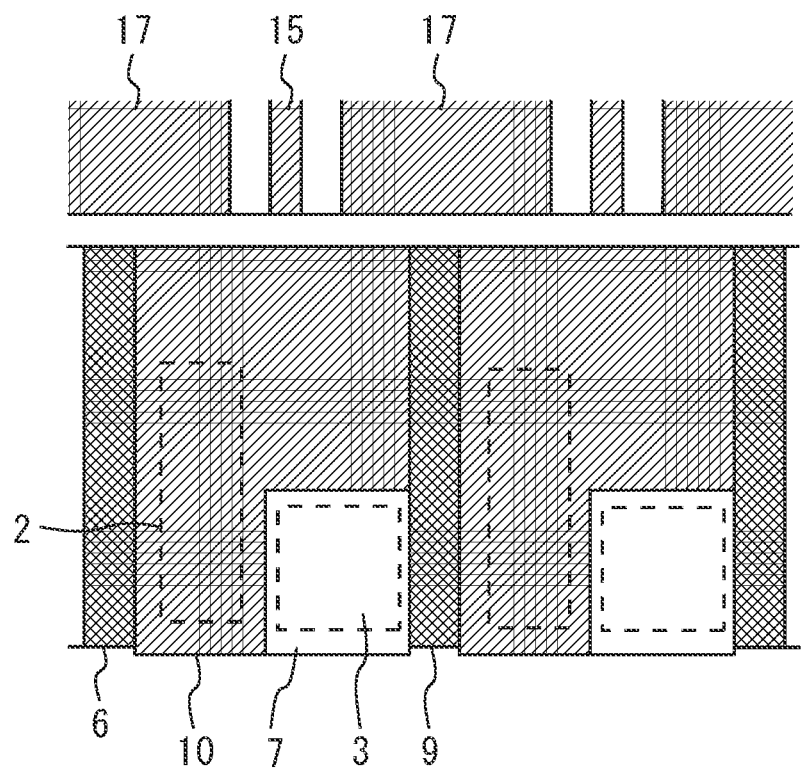
FIG. 10 is a plan view illustrating a conductive pattern provided between a carrier substrate and a submount of the optical semiconductor device according to the fourth embodiment.

FIG. 9 is a side view illustrating an optical semiconductor device according to a fourth embodiment. FIG. 10 is a plan view illustrating a conductive pattern provided between a carrier substrate and a submount of the optical semiconductor device according to the fourth embodiment. The submount 7 and components above the submount 7 are omitted in this plan view.

The conductive patterns 9 and 10 provided between the carrier substrate 6 and the submount 7 exist below the light emitting device 2, but do not exist below the capacitor 3. The conductive patterns 9 and 10 are bonded to each other below the light emitting device 2, so that heat generated by the light emitting device 2 can be dissipated on the carrier substrate 6 side.

In the first embodiment, the conductive patterns 9 and 10 which are GND patterns exist below the capacitor 3, and thus, parasitic capacity exists between the conductive pattern 13 and the conductive patterns 9 and 10. In contrast, the conductive patterns 9 and 10 do not exist below the capacitor 3 in the present embodiment, an interval between the conductive patterns can be expanded, so that parasitic capacity can be reduced. It is therefore possible to improve high frequency performance compared to the first embodiment. Other configurations and effects are similar to those in the first embodiment.

REFERENCE SIGNS LIST 1 optical semiconductor device; 2 light emitting device; 3 capacitor; 4 terminating resistor; 6 carrier substrate; 7 submount; 8 conductive pattern (GND pattern); 9 conductive pattern (GND pattern, second conductive pattern); 10 conductive pattern (third conductive pattern); 13 conductive pattern (first conductive pattern); 22 solder; 21 lower surface electrode; 23 upper surface electrode; 25 protruding portion

The invention claimed is:
1. An optical semiconductor device comprising:
a submount;
a first conductive pattern provided on an upper surface of the submount;
a GND pattern provided on a lower surface of the submount;
a light emitting device;
a capacitor having a lower surface electrode bonded to the first conductive pattern with solder and an upper surface electrode connected to the light emitting device; and
a terminating resistor connected to the first conductive pattern,
wherein the first conductive pattern has a protruding portion which protrudes outside from the capacitor in planar view,
the protruding portion protrudes from two or more portions at an outer periphery of the capacitor,
a width of the protruding portion is narrower than a width of the two or more portions of the outer periphery of the capacitor,
the lower surface electrode is provided on a whole surface of a lower surface of a dielectric body of the capacitor.
2. The optical semiconductor device according to claim 1, wherein the first conductive pattern has a rectangular planar shape,
the capacitor has a quadrangular planar shape,
a long side of the first conductive pattern is longer than a side of the capacitor,
a short side of the first conductive pattern is shorter than the side of the capacitor, and
the protruding portion protrudes from two facing sides of the capacitor.
3. The optical semiconductor device according to claim 2, comprising a plurality of sets,
wherein each set includes the submount, the first conductive pattern, the light emitting device, the capacitor, and the terminating resistor, and
the plurality of sets are arranged side-by-side in a direction along the short side of the first conductive pattern.
4. The optical semiconductor device according to claim 1, wherein the first conductive pattern has an L planar shape,
the capacitor has a quadrangular planar shape, and
the protruding portion protrudes from two adjacent sides of the capacitor.
5. The optical semiconductor device according to claim 1, wherein the protruding portion has a comb tooth shape.
6. An optical semiconductor device comprising:
a submount;
a first conductive pattern provided on an upper surface of the submount;
a GND pattern provided on a lower surface side of the submount;
a light emitting device;
a capacitor having a lower surface electrode bonded to the first conductive pattern with solder and an upper surface electrode connected to the light emitting device; and
a terminating resistor connected to the first conductive pattern,
a carrier substrate;
a second conductive pattern provided on an upper surface of the carrier substrate; and
a third conductive pattern provided on a lower surface of the submount,
wherein the first conductive pattern has a protruding portion which protrudes outside from the capacitor in planar view, a width of the protruding portion is narrower than a width of the capacitor, the protruding portion protrudes from two or more portions at an outer periphery of the capacitor, the submount is provided on the carrier substrate, the GND pattern is provided on a lower surface of the carrier substrate, and the second conductive pattern and the third conductive pattern are bonded to each other, exist below the light emitting device, but do not exist below the capacitor.

* * * * *